United States Patent [19]

Sardella et al.

[11] Patent Number: 5,766,974
[45] Date of Patent: Jun. 16, 1998

[54] METHOD OF MAKING A DIELECTRIC STRUCTURE FOR FACILITATING OVERETCHING OF METAL WITHOUT DAMAGE TO INTER-LEVEL DIELECTRIC

[75] Inventors: John C. Sardella, Highland Village, Tex.; Bruno Ricco, Bologna, Italy

[73] Assignee: SGS-Thomson Microelectronics, Inc., Carrollton, Tex.

[21] Appl. No.: 659,558

[22] Filed: Jun. 6, 1996

Related U.S. Application Data

[63] Continuation of Ser. No. 172,491, Dec. 23, 1993, abandoned.

[51] Int. Cl.⁶ ............................................. H01L 21/44
[52] U.S. Cl. .................... 437/195; 437/190; 437/194; 437/241; 437/DIG. 978; 156/646.1; 156/643.1
[58] Field of Search .................... 437/195, 190, 437/194, 241, DIG. 978; 216/102; 156/643.1, 646.1

[56] References Cited

U.S. PATENT DOCUMENTS

| 4,367,119 | 1/1983 | Logan et al. | 156/643 |
|---|---|---|---|
| 4,412,885 | 11/1983 | Wang et al. | 156/643 |
| 4,444,618 | 4/1984 | Saia et al. | 156/643 |
| 4,505,782 | 3/1985 | Jacob et al. | 156/643 |
| 5,169,801 | 12/1992 | Sato | 437/194 |
| 5,207,868 | 5/1993 | Shinohara | 156/656 |
| 5,270,254 | 12/1993 | Chen et al. | 437/194 |
| 5,288,665 | 2/1994 | Nulman | 437/195 |
| 5,346,582 | 9/1994 | Yachi | 156/626 |
| 5,354,418 | 10/1994 | Kumihashi et al. | 156/643 |
| 5,369,053 | 11/1994 | Fang | 437/194 |
| 5,411,631 | 5/1995 | Hori et al. | 216/72 |
| 5,444,022 | 8/1995 | Gardner | 437/194 |
| 5,534,462 | 7/1996 | Fiordalice et al. | 437/190 |
| 5,612,254 | 3/1997 | Mu et al. | 437/195 |

FOREIGN PATENT DOCUMENTS

| 0343698 | 4/1989 | European Pat. Off. . |
| 2104285 | 3/1983 | United Kingdom . |

OTHER PUBLICATIONS

"Self–aligned double–layer insulator process," IBM Technical Disclolsure Bulletin, vol. 32, No. 10A (1990) p. 221.
"Improved Stud Formation using a sacrificlal BN film" IBM, Technical Disclosure Bulletin, vol. 36, No. 03 (1993) p. 3.
Choe et al., "Production RIE–II, Selective Aluminom Alloy Etching", Solid State Technology; Mar. 1985, pp. 165–171.
Wolf et al., vol. I, Silicon Processing for the VLSI Era, Lattice Press, 1986, p. 195.
Wolf et al., vol. II, Silicon Processing for the VLSI Era, Lattice Press, 1990 pp. 51–54, 194–199, 273–275, 332–333.
Humphrey, "Use of Oxidized Silicon Nitride As An Etch Stop For Plasma Etching", IBM Tech. Discl. Bulletin, vol. 23, No. 4, Sep. 1980.
Heslop et al., "The Etching of Aluminum and Polysilicon in Chlorinated Plasmas", IEEE Conference, London UK, Mar. 2, 1982, pp. 2/1–2 of 28(Colloquium on Dry Etching Related to Silicon).

*Primary Examiner*—Charles L. Bowers, Jr.
*Assistant Examiner*—Lynne A. Gurley
*Attorney, Agent, or Firm*—Richard A. Bachand; Theodore E. Galanthay; Lisa K. Jorgenson

[57] ABSTRACT

Integrated circuit fabrication with a thin layer of oxynitride atop the interlevel dielectric, to provide an etch stop to withstand the overetch of the metal layer.

30 Claims, 1 Drawing Sheet

METHOD OF MAKING A DIELECTRIC STRUCTURE FOR FACILITATING OVERETCHING OF METAL WITHOUT DAMAGE TO INTER-LEVEL DIELECTRIC

This application is a continuation of application Ser. No. 08/172,491, filed Dec. 23, 1993 and now abandoned.

BACKGROUND AND SUMMARY OF THE INVENTION

The present invention relates to methods of fabrication of, and interlevel dielectric structures in, integrated circuits and similar devices.

With the increasing complexity of devices, as seen from the addition of more and denser layers of interconnection, the need for overetching becomes more prevalent. This overetch is required to remove the "stringers" or filaments seen at the edge of the deepest underlying features when the metal has been etched away from most of the area.

However, one of the by-products of the overetch step is an erosion of the contact oxide. This has the potential to cause device failure: if the oxide is very thin over a step, (which may be caused by reflow, for example), the overetching of the metal layer can poke through the insulating oxide and cause voids, which could later produce shorts. Current approaches increase the selectivity to oxide; however, this decreases the ability to remove the "stringers".

The disclosed inventions provide methods and structures which greatly reduce the danger of this. An etch stop layer is added to the top of the contact oxide, to provide an etch stop to withstand the overetch after the metal is cleared, and thereby prevent erosion of the oxide. In one class of embodiments, a disclosed innovative method adds a thin layer of oxynitride (e.g. 500–1000 Å) to the top of a much thicker (e.g. 5000–10,000 Å) silicate glass film (e.g. BPSG or PSG). The presence of nitride in the top film will retard the metal etch from etching into the contact oxide.

An advantage of the disclosed innovative method is its compatibility with conventional process flows. The innovative method departs from conventional processes only after the deposition and reflow of the doped silicate glass (typically BPSG or PSG). After reflow (which causes significant planarization), the thin oxynitride film is deposited. The contact etch can then be performed with greater safety. Processing then continues conventionally, with metal deposition, metal etch, etc. etc.

Thus, the disclosed innovations essentially eliminate oxide erosion during metal overetch step. As a result of this, the degree of overetching used with the metal etch can be increased if required. As a further result, since increased overetching can be tolerated, the requirements for planarization before deposition of the metal layer can be relaxed to some extent.

For example, a normal degree of overetch for metal-1 etching would be 40 or 50%—but with the present invention much larger degrees of overetching are permissible. For example, the presently preferred embodiment uses 110% overetching (i.e. etching for 2.1 times as long as would be required to remove the film from flat surfaces).

According to a disclosed class of innovative embodiments, there is provided: A method for fabricating integrated circuits, comprising the steps of: providing a partially fabricated structure which includes transistors; depositing an interlevel dielectric layer, predominantly comprising silicate glass, over said transistors; depositing a layer of silicon oxynitride over said interlevel dielectric layer; etching contact holes into said silicon oxynitride and interlevel dielectric layers, to expose portions of said transistors for electrical connection; depositing a layer of metal over said silicon oxynitride layer; and etching said metal with a plasma etch chemistry which includes chlorine, and continuing said etching step beyond the time required to clear said metal from flat surfaces; whereby said oxynitride layer protects said interlevel dielectric from erosion by said metal etching step.

According to another disclosed class of innovative embodiments, there is provided: A method for fabricating integrated circuits, comprising the steps of: providing a partially fabricated structure which includes transistors; depositing an interlevel dielectric layer over said transistors; depositing an insulating etch stop layer over said interlevel dielectric layer; etching contact holes into said etch stop and interlevel dielectric layers, to expose portions of said transistors for electrical connection; depositing a layer of metal over said etch stop layer; and etching said metal, with a plasma etch chemistry which etches the material of said etch stop layer more slowly than the material of said interlevel dielectric and more slowly than the material of said metal, and continuing said etching step for more than 175% of the time required to clear said metal from flat surfaces; whereby said etch stop layer protects said interlevel dielectric from erosion by said metal etching step.

According to another disclosed class of innovative embodiments, there is provided: A method for fabricating integrated circuits, comprising the steps of: providing a partially fabricated structure which includes transistors; depositing an interlevel dielectric layer over said transistors; depositing an insulating etch stop layer over said interlevel dielectric layer; etching contact holes into said etch stop and interlevel dielectric layers, to expose portions of said transistors for electrical connection; depositing a layer of metal over said etch stop layer; and etching said metal, with a plasma etch chemistry which etches the material of said etch stop layer more slowly than the material of said interlevel dielectric and more slowly than the material of said metal, and continuing said etching step beyond the time required to clear said metal from flat surfaces; whereby said etch stop layer protects said interlevel dielectric from erosion by said metal etching step.

According to another disclosed class of innovative embodiments, there is provided: an integrated circuit, comprising: a substrate including at least one monolithic body of semiconductor material, and transistors formed therein; an interlevel dielectric layer, predominantly comprising silicate glass, over said transistors; a layer of silicon oxynitride over said interlevel dielectric layer; contact holes extending through said silicon oxynitride and interlevel dielectric layers; a patterned thin-film layer of metal running over said silicon oxynitride layer and extending down into said contact holes, to connect said transistors in a desired electrical configuration.

BRIEF DESCRIPTION OF THE DRAWING

The present invention will be described with reference to the accompanying drawings, which show important sample embodiments of the invention and which are incorporated in the specification hereof by reference, wherein.

DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Figure 1:
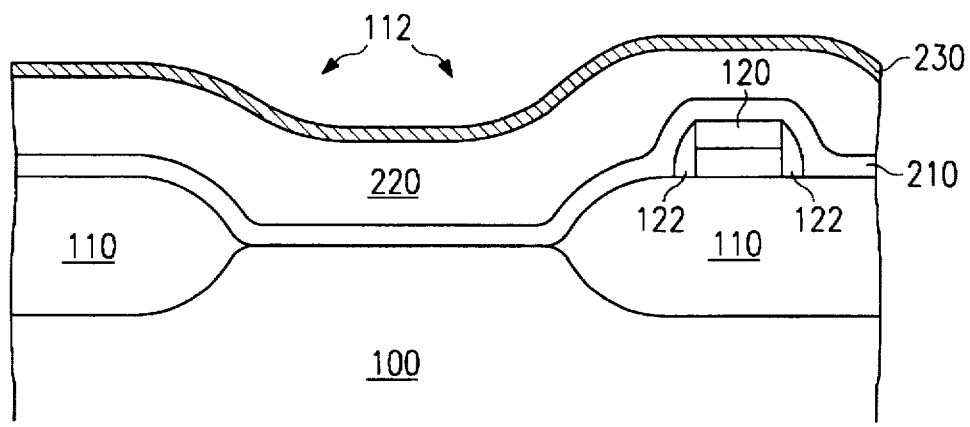
FIG. 1 shows a process according to a sample embodiment, wherein oxynitride has been deposited on BPSG after reflow.

FIG. 1 shows a partially fabricated structure according to a sample embodiment. In this embodiment a monocrystalline silicon substrate 100 has had field oxide regions 110 grown on it, to define active device regions 112 where the field oxide 110 is not present. A polycide layer 120 (silicide-clad polysilicon) has been patterned to form transistor gates and interconnects, and sidewall spacers 122 have been formed on the edges of the patterned layer. (Second, third, and fourth layers of polysilicon, with associated interlevel dielectrics, can be added to the process if desired.)

Thereafter an interlevel dielectric is formed: an undoped layer 210 of low-temperature oxide is first deposited, e.g. 1000 to 2000 Å of TEOS or of plasma oxide.

A layer 220 of BPSG (borophosphosilicate glass) is then deposited, to e.g. 3000 to 6000 Å, and a reflow/densification step is performed (e.g. 25 minutes at a temperature of 875° C., in the presently preferred embodiment). Alternatively, PSG (phosphosilicate glass) or other doped silicate glasses, or other interlevel dielectric materials (including composite multilayer structures) can be used instead.

A layer 230 of oxynitride is now deposited by conventional CVD methods. In the presently preferred embodiment, this is deposited to have a refractive index of 1.75, but the O/N ratio can be varied to provide different optical densities (and different O/N ratios) if desired. In the presently preferred embodiment, this is deposited to have a thickness of 800 Å, but the thickness can be varied if desired (preferably within the range of 500–1000 Å and less preferably within a wider range). A smaller thickness will provide less protection against erosion, but an excessive thickness will unnecessarily increase the aspect ratio of the contact holes.

Figure 2:
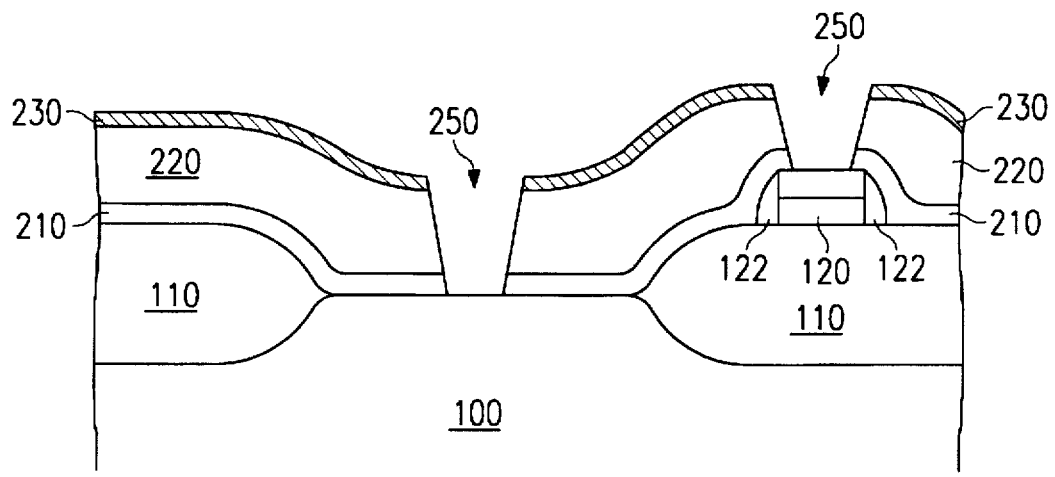
FIG. 2 shows a later stage of processing of the embodiment of FIG. 1, after contacts have been patterned and etched.

FIG. 2 shows a later stage of processing of the embodiment of FIG. 1, after contacts 250 have been patterned and etched. Two locations of contacts 250 are illustrated, one (on the left) exemplifying a contact to active and the other (on the right) exemplifying a contact to poly-1. In etching these contacts, conventional fluoro-etch oxide-etching chemistries can be used, since these will etch oxynitride too.

Figure 3:
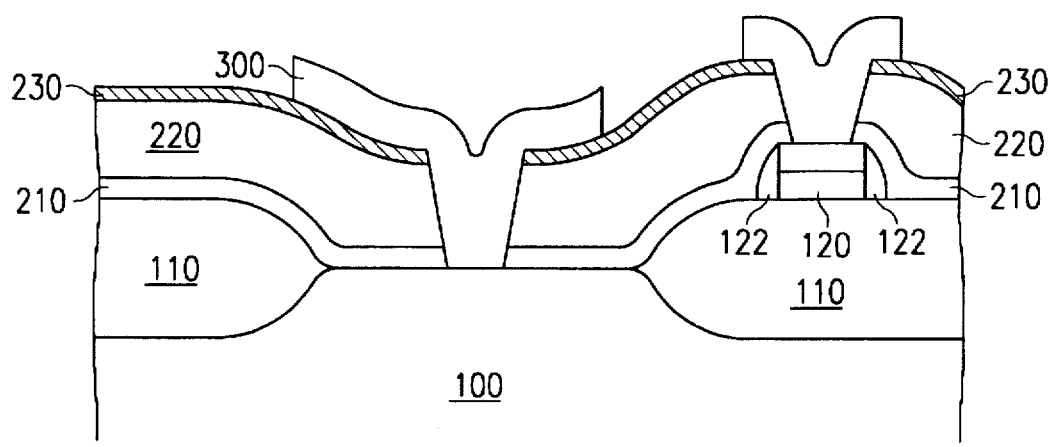
FIG. 3 shows a later stage of processing of the embodiment of FIG. 2, after metal has been deposited, patterned and etched.

FIG. 3 shows a later stage of processing of the embodiment of FIG. 2, after metal 300 has been deposited, patterned and etched. The metal 300 may be, for example, Al:1% Cu over a Ti/TiN barrier layer, but of course other compositions may be used. The metal etch chemistry, in the presently preferred embodiment, is $BCl_3+Cl_2+SiCl_4+CHF_3$, but of course other chemistries can be used. This chemistry will etch the aluminum alloy at about 700 Å/min, and etches BPSG at about 120 Å/min, but etches oxynitride only at about 60 Å/min. For a total metal thickness of 7500 Å, over the moderate planarization provided by the reflowed BPSG layer, about 960 sec of overetching will typically be required from the time the metal first begins to clear. The oxynitride withstands this, which is particularly advantageous at locations where the interlevel dielectric is otherwise relatively thin, e.g. near corners of the poly-1 level over field oxide.

Processing continues with conventional steps to complete fabrication, e.g. deposition and planarization of further interlevel dielectric, via patterning, second metal deposition and etch, protective overcoat deposition, etching contact pad apertures, etc. etc. See generally, e.g., VLSI TECHNOLOGY (2.ed. Sze 1988); G. Anner, PLANAR PROCESSING PRIMER (1990); R. Castellano, SEMICONDUCTOR DEVICE PROCESSING (1991); W. Runyan & K. Bean, SEMICONDUCTOR INTEGRATED CIRCUIT PROCESSING TECHNOLOGY (1990 ed.); and the annual proceedings of the IEDM conferences; all of which are hereby incorporated by reference.

Advantages

Thus, the disclosed innovations, in various embodiments provide some or all of at least the following advantages:

1. Eliminates oxide etching during metal overetch step.
2. Allows overetch step to be increased, if required, since oxide loss is eliminated.
3. Since increased overetching can be tolerated, the requirements for planarization before deposition of the metal layer can be relaxed.
4. High compatibility with conventional process flows.

Further Modifications and Variations

It will be recognized by those skilled in the art that the innovative concepts disclosed in the present application can be applied in a wide variety of contexts. Moreover, the preferred implementation can be modified in a tremendous variety of ways. Accordingly, it should be understood that the modifications and variations suggested below and above are merely illustrative. These examples may help to show some of the scope of the inventive concepts, but these examples do not nearly exhaust the full scope of variations in the disclosed novel concepts.

A variety of interlevel dielectrics can be substituted for the undoped oxide 210 and BPSG 220 of the preferred embodiment, including without limitation phosphosilicates, germanosilicates, arsenosilicates or other doped silicate glasses, other inorganic interlevel dielectric materials, and composite multilayer structures of many kinds.

In one modification of this method, the interlevel dielectric is further treated, after the step of etching contact holes, to smooth the uppermost portions of said contact holes.

In one class of embodiments, the ratio of the as-deposited thickness of said metal layer to the as-deposited thickness of said silicon oxynitride layer is in the range between 5:1 and 10:1.

In one class of embodiments, the silicon oxynitride layer is deposited to an initial thickness in the range of 500–1000 Å.

In some processes it may also be possible to use an oxynitride layer over a polyimide or other organic interlevel dielectric materials. In such cases it may be preferable to use plasma-assisted low-temperature deposition of the oxynitride atop the interlevel dielectric.

While the disclosed process could be used for via formation, it is much less preferable in that context. The dielectric constant for nitride is about twice that for oxide, so that the parasitic capacitive loading on the metal lines would be increased.

While the inventions have been described with primary reference to a single-poly process, it will be readily recognized that these inventions are equally applicable to double-, triple- or quadruple-poly structures and processes. Similarly, while the contact from first metal to first poly and active has been particularly described, it will be readily recognized that the disclosed inventions are equally applicable to processes with multiple layers of metal.

The innovative process teachings may also be adapted for contact formation in bipolar or other device technologies.

Similarly, it will be readily recognized that the described process steps can also be embedded into hybrid process flows, such as BiCMOS or smart-power processes.

Of course a variety of structures can be used to implement the polysilicon or polycide gate. Similarly, while sidewall spacers are normally used, they are not strictly necessary to the practice of the invention.

Similarly, a wide variety of materials, and of combinations of materials, can be used to implement the metal layer.

Of course, the specific etch chemistries, layer compositions, and layer thicknesses given are merely illustrative, and do not by any means delimit the scope of the claimed inventions.

As will be recognized by those skilled in the art, the innovative concepts described in the present application can be modified and varied over a tremendous range of applications, and accordingly the scope of patented subject matter is not limited by any of the specific exemplary teachings given.

What is claimed is:

1. A method for fabricating integrated circuits, comprising the steps of:
   (a) providing an integrated circuit structure on which transistors have been fabricated;
   (b) depositing an interlevel dielectric layer, essentially comprising silicate glass, over said transistors;
   (c) depositing a layer of silicon oxynitride over said interlevel dielectric layer;
   (d) etching contact holes into said silicon oxynitride and interlevel dielectric layers, to expose portions of said transistors for electrical connection;
   (e) depositing a layer of metal over said silicon oxynitride layer; and
   (f) etching said metal layer with a plasma etch chemistry which includes chlorine, wherein said silicon oxynitride layer is etched by said plasma etch chemistry more slowly than said dielectric lever and said dielectric layer etched by said plasma etch chemistry more slowly than said metal layer; and
   (g) continuing said etching step for more than 175% of the time required to clear said metal layer from flat surfaces; whereby said silicon oxynitride layer protects said interlevel dielectric from erosion by said metal etching step.

2. The method of claim 1, wherein said interlevel dielectric comprises a doped silicate glass over an undoped silicate glass.

3. The method of claim 1, wherein said interlevel dielectric comprises at least two layers.

4. The method of claim 1, wherein said interlevel dielectric comprises borophosphosilicate glass.

5. The method of claim 1, wherein said interlevel dielectric is reflowed prior to deposition of said silicon oxynitride layer.

6. The method of claim 1, wherein said silicon oxynitride layer consists of silicon oxynitride having a refractive index of 175.

7. The method of claim 1, wherein the ratio of the as-deposited thickness of said metal layer to the as-deposited thickness of said silicon oxynitride layer is in the range between 5:1 and 10:1.

8. The method of claim 7, wherein said silicon oxynitride layer is deposited to an initial thickness of about 800 Å.

9. The method of claim 1, wherein said metal layer is deposited to an initial thickness in the range between about 3000 Å and about 6000 Å inclusive.

10. The method of claim 1, wherein said metal layer comprises an alloy of aluminum.

11. The method of claim 1, wherein said metal layer comprises an alloy of aluminum over a barrier layer comprising at least 40% of titanium.

12. The method of claim 1, wherein said metal layer comprises a multilayer structure.

13. The method of claim 1, wherein said interlevel dielectric is further treated, after said step of etching contact holes, to smooth the uppermost portions of said contact holes.

14. The method of claim 1, wherein said interlevel dielectric has a total thickness in the range of 3000–10,000 Å inclusive.

15. The method of claim 1, wherein said silicon oxynitride layer is deposited to an initial thickness in the range of 500–1000 Å.

16. A method for fabricating integrated circuits, comprising the steps of:
   (a) providing an integrated circuit structure on which transistors have been fabricated;
   (b) depositing an interlevel dielectric layer comprising a silicate glass over said transistors;
   (c) depositing an insulating etch stop layer over said interlevel dielectric layer;
   (d) etching contact holes into said etch stop and interlevel dielectric layers, to expose portions of said transistors for electrical connection;
   (e) depositing a layer of metal over said etch stop; and
   (f) etching said metal layer with a plasma etch chemistry which etches the material of said etch stop layer more slowly than the material of said interlevel dielectric and more slowly than the material of said metal layer, and which etches said dielectric layer more slowly than the material of said metal layer; and
   (g) continuing said etching step for more than 175% of the time required to clear said metal layer from flat surfaces; whereby said etch stop layer protects said interlevel dielectric from erosion by said metal etching step.

17. The method of claim 16, wherein said interlevel dielectric comprises a doped silicate glass over an undoped silicate glass.

18. The method of claim 16, wherein said interlevel dielectric comprises at least two layers.

19. The method of claim 16, wherein said interlevel dielectric comprises borophosphosilicate glass.

20. The method of claim 16, wherein said interlevel dielectric is reflowed prior to deposition of said etch stop layer.

21. The method of claim 16, wherein said etch stop layer consists of silicon oxynitride having a refractive index of 1.75.

22. The method of claim 16, wherein the ratio of the as-deposited thickness of said metal layer to the as-deposited thickness of said etch stop layer is in the range between 5:1 and 10:1.

23. The method of claim 22, wherein said etch stop layer is deposited to an initial thickness of about 800 Å.

24. The method of claim 16, wherein said metal layer is deposited to an initial thickness in the range between about 3000 Å and about 6000 Å inclusive.

25. The method of claim 16, wherein said metal layer comprises a multilayer structure.

26. The method of claim 16, wherein said interlevel dielectric is further treated, after said step of etching contact holes, to smooth the uppermost portions of said contact holes.

27. The method of claim 16, wherein said interlevel dielectric has a total thickness in the range of 3000–10,000 Å inclusive.

28. The method of claim 16, wherein said etch stop layer is deposited to an initial thickness in the range of 500–1000 Å.

29. A method for fabricating integrated circuits, comprising the steps of:

(a) providing an integrated circuit structure on which transistors have been fabricated;

(b) depositing an interlevel dielectric layer comprising a silicate glass over said transistors;

(c) depositing an insulating etch stop layer over said interlevel dielectric layer;

(d) etching contact holes into said etch stop and interlevel dielectric layers, to expose portions of said transistors for electrical connection;

(e) depositing a layer of metal over said etch stop wherein said metal layer comprises an alloy of aluminum; and (f) etching said metal layer with a plasma etch chemistry which etches the material of said etch stop layer more slowly than the material of said interlevel dielectric and more slowly than the material of said metal layer, and continuing said etching step for more than 175% of the time required to clear said metal layer from flat surfaces;

whereby said etch stop layer protects said interlevel dielectric from erosion by said metal etching step.

30. The method of claim 29, wherein said metal layer comprises an alloy of aluminum over a barrier layer comprising at least 40% of titanium.

* * * * *

UNITED STATES PATENT AND TRADEMARK OFFICE
CERTIFICATE OF CORRECTION

PATENT NO : 5,766,974
DATED : June 16 1998
INVENTOR(S): Sardella et al.

It is certified that error appears in the above-identified patent and that said Letters Patent is hereby corrected as shown below:

Cover Page, item 75 Inventors, delete "; Bruno Ricco, Bologna, Italy"

Signed and Sealed this

Third Day of November, 1998

Attest:

BRUCE LEHMAN

Attesting Officer

Commissioner of Patents and Trademarks